(12) United States Patent
Lee et al.

(10) Patent No.: US 8,184,452 B2
(45) Date of Patent: May 22, 2012

(54) WIRELESS INPUT APPARATUS

(75) Inventors: Tsung-Shih Lee, Taipei (TW); Wei-Hao Huang, Taipei (TW); Shu-Chen Lin, Taipei (TW)

(73) Assignee: Cheng Uei Precision Industry Co., Ltd., New Taipei (TW)

( * ) Notice: Subject to any disclaimer, the term of this patent is extended or adjusted under 35 U.S.C. 154(b) by 238 days.

(21) Appl. No.: 12/779,019

(22) Filed: May 12, 2010

(65) Prior Publication Data

US 2011/0279994 A1 Nov. 17, 2011

(51) Int. Cl.
*H05K 7/02* (2006.01)
*H05K 7/04* (2006.01)
(52) U.S. Cl. ......... 361/807; 361/727; 361/801; 361/803
(58) Field of Classification Search .................. 361/600, 361/679.01, 679.02, 727, 732, 740, 741, 361/747, 756, 801–803; 455/73, 575.1, 575.7, 455/556.1, 403, 90.3, 347, 95, 100
See application file for complete search history.

(56) References Cited

U.S. PATENT DOCUMENTS

| 5,940,502 | A  | * | 8/1999  | Hirai et al. ..................... 379/446   |
| 6,178,094 | B1 | * | 1/2001  | Hakozaki ....................... 361/796     |
| 6,275,383 | B1 | * | 8/2001  | Bohm ............................ 361/752    |
| 7,359,183 | B2 | * | 4/2008  | Wu et al. ................... 361/679.01     |
| 7,525,807 | B2 | * | 4/2009  | Ohta et al. ..................... 361/737    |
| 7,839,646 | B2 | * | 11/2010 | Zadesky et al. ............... 361/728       |

* cited by examiner

*Primary Examiner* — Hung S Bui
(74) *Attorney, Agent, or Firm* — Lin & Associates IP, Inc.

(57) ABSTRACT

A wireless input apparatus includes a shell having a recess at a top surface thereof. The recess has an opening at a rear wall thereof. A bottom of the recess is formed with two abreast sliding slots which extend perpendicular to the rear wall. A stopper is disposed across each sliding slot and spaced from a rear side of the sliding slot to form a stopping recess. Each of two opposite lateral walls of the recess has a guiding trough. A rear side of the guiding trough has a buckling notch at a lower portion thereof. A wireless transmitter has a main body and an insertion portion protruded from a rear end of the main body. The main body has two lumps at a bottom thereof corresponding to the stopping recesses, and a pair of sliding pieces protruded outwards from two opposite sides thereof corresponding to the buckling notches.

5 Claims, 3 Drawing Sheets

WIRELESS INPUT APPARATUS

BACKGROUND OF THE INVENTION

1. Field of the Invention

The present invention relates to an input apparatus, and more specifically to a wireless input apparatus.

2. The Related Art

With the electronic technology developing, more and more wireless input apparatus, such as wireless mouse, wireless keyboard and so on, are designed and produced for convenient use. The wireless input apparatus is generally involved with a wireless input device for inputting the information, and a wireless transmitter mounted to an information processing machine, such as computer, for transmitting the inputted information from the wireless input device to the information processing machine wirelessly. But, as the wireless transmitter is so small with respect to the information processing machine that the wireless transmitter is liable to lose, it is desirable for the wireless input device to be designed and formed with a structure for accommodating the wireless transmitter.

A conventional method for fixing the wireless transmitter to the wireless input device is that the shell of the wireless input device, such as wireless mouse, is molded with a receiving recess, for receiving the wireless transmitter. A plurality of blocking lumps, made of rubber, is molded to the receiving recess for resting against the inserted wireless transmitter resiliently, for preventing the wireless transmitter from falling off However, such method needs to use a twinshot co-injection molding machine for integrally forming the receiving recess and the blocking lumps, which increases the manufacturing cost. Another conventional method for fixing the wireless transmitter to the wireless input device is that the shell of the wireless input device is molded with a receiving recess, with a plurality of fixing lumps formed therein. A plurality of blocking elements, which is made of rubber, is respectively fixed to the fixing lumps for resting against the inserted wireless transmitter resiliently so as to prevent the wireless transmitter from falling off. However, it is difficult to assemble the blocking elements to the fixing lumps together because the blocking elements and the fixing lumps are very small.

SUMMARY OF THE INVENTION

An object of the invention is to provide a wireless input apparatus. The wireless input apparatus includes a shell and a wireless transmitter. The shell has a recess at a top surface thereof. The recess has an opening at a rear wall thereof. A bottom of the recess is formed with two abreast sliding slots which extend perpendicular to the rear wall. A stopper is disposed across each sliding slot and spaced from a rear side of the sliding slot to form a stopping recess. Each of two opposite lateral walls of the recess has a guiding trough extending upwards and downwards. A rear side of the guiding trough has a buckling notch at a lower portion thereof. The wireless transmitter has a main body and an insertion portion protruded from a rear end of the main body. The main body has two lumps at a bottom thereof corresponding to the stopping recesses, and a pair of sliding pieces protruded outwards from two opposite sides thereof corresponding to the buckling notches. The wireless transmitter is received into the recess. The insertion portion projects out of the rear wall through the opening. The lumps slide forward in the sliding slots and across the stoppers to be restrained in the stopping recesses. The sliding pieces are inserted into the guiding troughs and moved forwards to buckle in the buckling notches.

As described above, the recess is formed at the shell for receiving the wireless transmitter. The main body is fixed in the recess by means of the sliding pieces buckled in the buckling notches and the lumps restrained in stopping recesses, thereby the wireless transmitter mounted to the shell firmly. Such structure is simple, which is easy and convenient to manufacture and assemble, furthermore, reduces the manufacture cost of the wireless input apparatus.

BRIEF DESCRIPTION OF THE DRAWINGS

The invention, together with its objects and the advantages thereof may be best understood by reference to the following description taken in conjunction with the accompanying drawings, in which.

DETAILED DESCRIPTION OF THE EMBODIMENT

Figure 1:
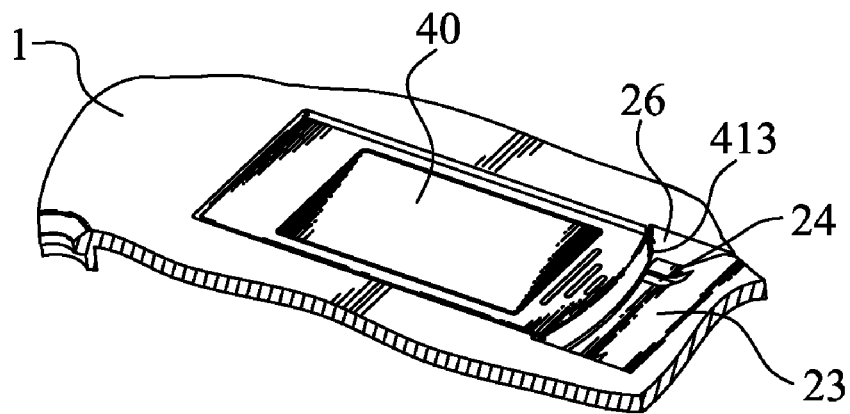
FIG. 1 is a partial, assembled perspective view of a wireless input apparatus of an embodiment in accordance with the present invention.
Figure 2:
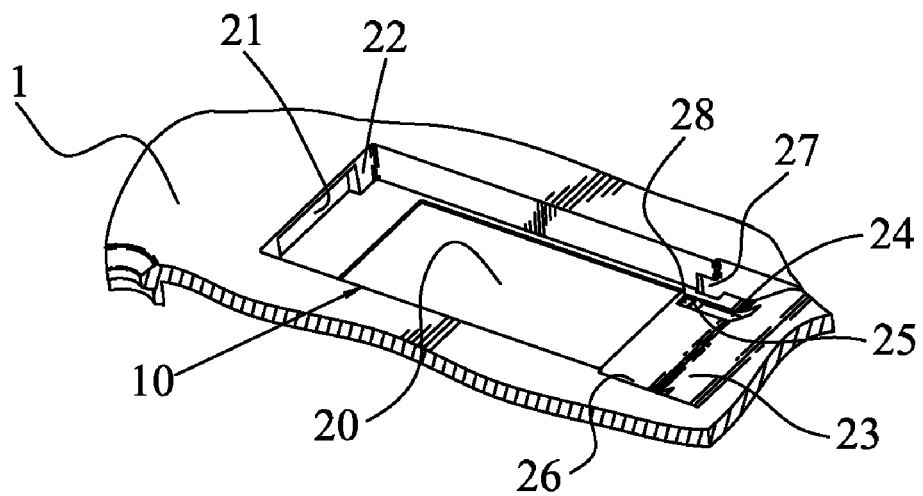
FIG. 2 is a partial perspective view of a shell of the wireless input apparatus shown in FIG. 1.
Figure 3:
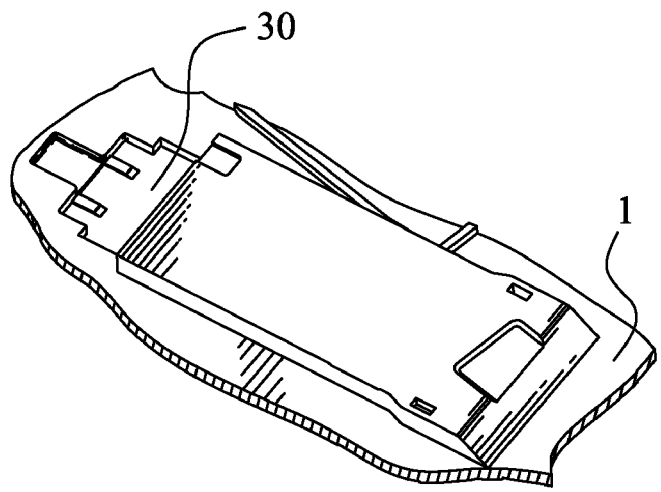
FIG. 3 is a partial perspective view of the shell of the wireless input apparatus of FIG. 2 viewed from another angle.

With Reference to FIGS. 1-3, an embodiment of a wireless input apparatus according to the present invention is shown. The wireless input apparatus comprises a wireless input device and a wireless transmitter 40 received in the wireless input device. The wireless input device has a shell 1. The shell 1 is formed with a receiving recess 10. The receiving recess 10 includes a second recess 20 at a top surface of the shell 1, and a first recess 30 at a bottom surface of the shell 1 and disposed rearwards of the second recess 20. The second recess 20 and the first recess 30 are substantially rectangular. A rear wall 22 of the second recess 20 has an opening 21 at a substantially middle portion thereof, for communicating the second recess 20 with the first recess 30.

The second recess 20 has a front wall which is shaped as an oblique surface, named as guiding surface 23. Two abreast sliding slots 24 are formed at a bottom of the second recess 20, and extend toward the guiding surface 23 with a predetermined distance. The sliding slots 24 extend frontward and rearwards. A stopper 25 is located across each sliding slot 24, and spaced from a rear side of the sliding slot 24, away from the guiding surface 23, with a predetermined distance to form a stopping recess 28. Each of two opposite lateral walls of the second recess 20 has a front end formed with a guiding trough 26. The guiding troughs 26 extend upwards and downwards, and reach the guiding surface 23. A lower portion of a rear side of the guiding trough 26 is formed with a buckling notch 27. The buckling notch 27 is adjacent to the corresponding stopper 25 and reaches the bottom surface of the second recess 20.

Figure 4:
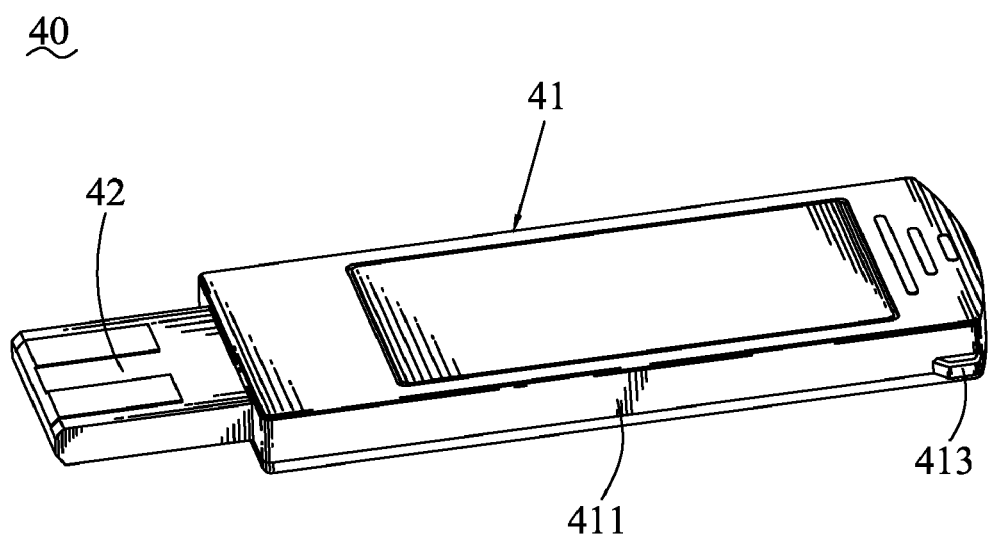
FIG. 4 is a perspective view of a wireless transmitter of the wireless input apparatus shown in FIG. 1.
Figure 5:
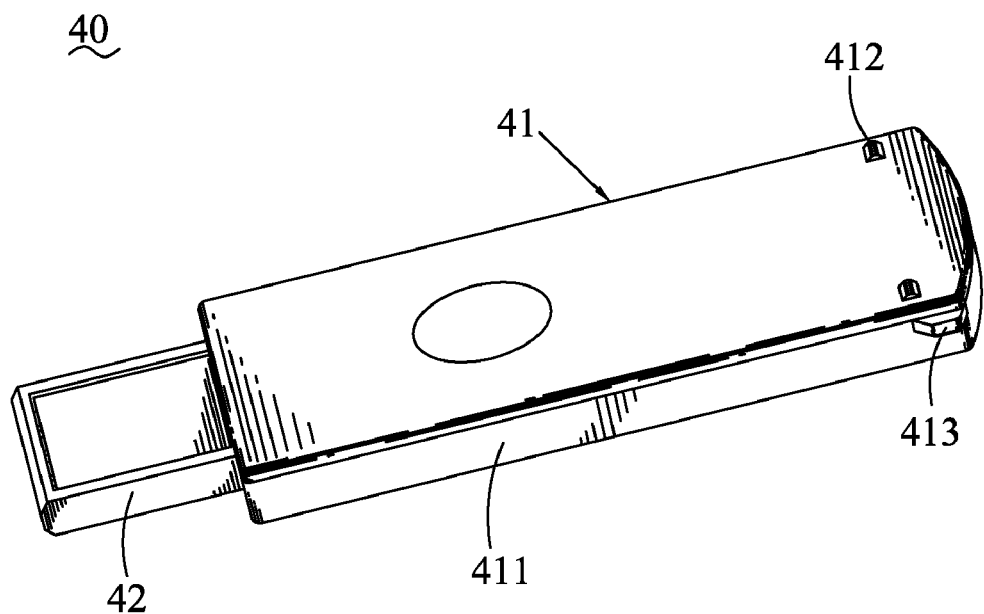
FIG. 5 is a perspective view of a wireless transmitter of the wireless input apparatus shown in FIG. 4 viewed from another angle.
Figure 6:
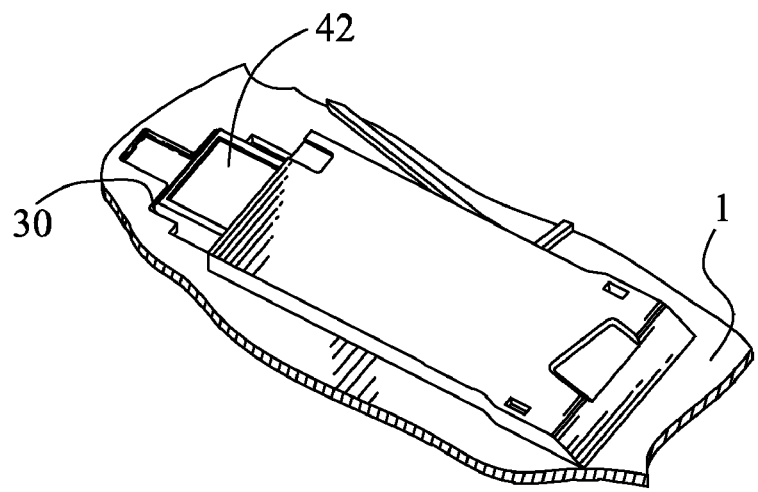
FIG. 6 is a partial, assembled perspective view of the wireless input apparatus of FIG. 1 viewed from another angle.

Please refer to FIGS. 4-5, the wireless transmitter 40 has a rectangular main body 41 and a rectangular insertion portion 42 protruded rearwards from a middle portion of a rear end of the main body 41. The main body 41 is surrounded by a shelter 411. A bottom of the shelter 411 is protruded downwards to form two lumps 412 at two opposite sides of a front end thereof corresponding to the stopping recesses 28. Each of two opposite sides of the shelter 411 is projected outwards to form a sliding piece 413 at a front end thereof. The sliding pieces 413 are adjacent to the respective lumps 412, corresponding to the buckling notches 27.

With reference to FIGS. 1-2 and FIGS. 5-6, in assembly, the wireless transmitter 40 is inserted into the receiving recess 10 in a from-and-rear direction. The bottom surface of the main body 41 is attached to the guiding surface 23. The wireless transmitter 40 is pressed and slid forwardly into the second recess 20. The insertion portion 42 passes through the opening 21 and enters the first recess 30. The lumps 412 slide along the sliding slots 24 and locked in the stopping recesses 28, for fixing the wireless transmitter 40 in the receiving recess 10 and preventing the wireless transmitter 40 from moving levelly. The sliding pieces 413 pass through the guiding troughs 26 and buckled in the buckling notches 27 for preventing the wireless transmitter 40 from moving upwards. In disassembly, the main body 41 is forced to move rearwards. As the shell 1 is made of plastic material and has certain resilient deformation, the lumps 412 can be forced to slide across the stoppers 25 and move out of the sliding slots 24. The sliding pieces 413 are correspondingly forced to slide out of the buckling notches 27. Thus, the wireless transmitter 40 is released from the receiving recess 10.

As described above, the receiving recess 10 is formed at the shell 1 for receiving the wireless transmitter 40. The insertion portion 42 is received in the first recess 30 through the opening 21. The main body 41 is fixed in the second recess 20 by means of the sliding pieces 413 buckled in the buckling notches 27 and the lumps 412 restrained in stopping recesses 28, thereby the wireless transmitter 40 mounted to the shell 1 firmly. Such structure is simple, which is easy and convenient to manufacture and assemble, furthermore, reduces the manufacture cost of the wireless input apparatus.

What is claimed is:
1. A wireless input apparatus, comprising:
a shell having a recess at a top surface thereof, the recess having an opening at a rear wall thereof, a bottom of the recess being formed with two abreast sliding slots which extend perpendicular to the rear wall, a stopper disposed across each sliding slot and spaced from a rear side of the sliding slot to form a stopping recess, each of two opposite lateral walls of the recess having a guiding trough extending upwards and downwards, a rear side of the guiding trough having a buckling notch at a lower portion thereof;
a wireless transmitter having a main body and an insertion portion protruded from a rear end of the main body, the main body having two lumps at a bottom thereof corresponding to the stopping recesses, and a pair of sliding pieces protruded outwards from two opposite sides thereof corresponding to the buckling notches;
wherein the wireless transmitter is received into the recess, the insertion portion projects out of the rear wall through the opening, the lumps slide forward in the sliding slots and across the stoppers to be restrained in the stopping recesses, the sliding pieces are inserted into the guiding troughs and moved forward to buckle with the buckling notches.

2. The wireless input apparatus as claimed in claim 1, wherein a bottom surface of the shell has a first recess rearward of the recess, with a shape thereof depending on that of the insertion portion, the first recess communicates with the recess by the opening, for receiving the inserted insertion portion.

3. The wireless input apparatus as claimed in claim 1, wherein the recess has a front wall shaped as an oblique surface, named as a guiding surface, for guiding the wireless transmitter to slide into the recess.

4. The wireless input apparatus as claimed in claim 3, wherein the guiding troughs are adjacent to and reach the guiding surface, the sliding slots extend to the guiding surface with a predetermined distance.

5. The wireless input apparatus as claimed in claim 4, wherein the buckling notch is disposed adjacent to the corresponding stopper.

* * * * *